(12) United States Patent
Imada

(10) Patent No.: US 8,941,093 B2
(45) Date of Patent: Jan. 27, 2015

(54) COMPOUND SEMICONDUCTOR DEVICE AND MANUFACTURING METHOD THEREOF

(71) Applicant: Fujitsu Limited, Kawasaki-shi, Kanagawa (JP)

(72) Inventor: Tadahiro Imada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/971,921

(22) Filed: Aug. 21, 2013

(65) Prior Publication Data

US 2013/0334540 A1    Dec. 19, 2013

Related U.S. Application Data

(63) Continuation of application No. PCT/JP2011/056580, filed on Mar. 18, 2011.

(51) Int. Cl.
| | | |
|---|---|---|
| H01L 29/06 | (2006.01) | |
| H01L 29/201 | (2006.01) | |
| H01L 29/732 | (2006.01) | |
| H01L 27/095 | (2006.01) | |
| H01L 21/00 | (2006.01) | |

(Continued)

(52) U.S. Cl.
CPC ........ *H01L 29/778* (2013.01); *H01L 29/66462* (2013.01); *H01L 29/7787* (2013.01); *H01L 29/66431* (2013.01); *H01L 29/861* (2013.01); *H01L 29/1075* (2013.01); *H01L 29/2003* (2013.01); *H01L 21/02458* (2013.01); *H01L 21/0254* (2013.01); *H01L 21/0262* (2013.01); *H01G 4/1272* (2013.01)

USPC ............... 257/12; 257/90; 257/183; 257/189; 257/472; 438/46; 438/47; 438/167; 438/172

(58) Field of Classification Search
USPC .......... 438/167, 172, 173, 46, 47; 257/12, 22, 257/90, 183, 189, 472
See application file for complete search history.

(56) References Cited

U.S. PATENT DOCUMENTS 5,929,467 A    7/1999    Kawai
6,462,354 B1 *   10/2002    Okuyama ...................... 257/13

(Continued)

FOREIGN PATENT DOCUMENTS

| JP | H10-223901 | 8/1998 |
| JP | 2002-252552 A1 | 9/2002 |

(Continued)

OTHER PUBLICATIONS

M. Miczek, et al.; "Effects of interface states and temperature on the C-V behavior of metal/insulator/AlGaN/GaN hererostructure capacitors;" Journal of Applied Physics; vol. 103; 2008; pp. 104510-1-104510-11 (11 Sheets)/Cited in International Search Report.

(Continued)

*Primary Examiner* — Hsien Ming Lee
(74) *Attorney, Agent, or Firm* — Kratz, Quintos & Hanson, LLP

(57) ABSTRACT

A first electrode, an intrinsic first compound semiconductor layer over the first electrode, a second compound semiconductor layer whose band gap is smaller than that of the first compound semiconductor layer on the first compound semiconductor layer, and a second electrode over the second compound semiconductor layer are provided.

7 Claims, 6 Drawing Sheets

(51) Int. Cl.
*H01L 21/338* (2006.01)
*H01L 29/778* (2006.01)
*H01L 29/66* (2006.01)
*H01L 29/861* (2006.01)
*H01L 29/10* (2006.01)
*H01L 29/20* (2006.01)
*H01L 21/02* (2006.01)
*H01G 4/12* (2006.01)

(56) References Cited

U.S. PATENT DOCUMENTS

| | | | | |
|---|---|---|---|---|
| 6,566,692 | B2* | 5/2003 | Uenoyama et al. | 257/191 |
| 6,674,101 | B2* | 1/2004 | Yoshida | 257/194 |
| 8,195,653 | B2* | 6/2012 | Dandekar et al. | 707/724 |
| 8,294,181 | B2* | 10/2012 | Kikkawa et al. | 257/194 |
| 2003/0131788 | A1* | 7/2003 | Ueda | 117/108 |
| 2003/0222276 | A1* | 12/2003 | Nishii et al. | 257/189 |
| 2006/0180831 | A1* | 8/2006 | Nakazawa et al. | 257/189 |
| 2007/0228401 | A1* | 10/2007 | Machida et al. | 257/96 |
| 2008/0283870 | A1 | 11/2008 | Sato | |
| 2008/0315257 | A1 | 12/2008 | Shiraishi | |
| 2009/0166677 | A1 | 7/2009 | Shibata | |
| 2010/0314666 | A1* | 12/2010 | Saito et al. | 257/201 |
| 2011/0031532 | A1* | 2/2011 | Kikkawa et al. | 257/194 |
| 2011/0042787 | A1* | 2/2011 | Sato | 257/615 |
| 2011/0049527 | A1* | 3/2011 | Sato | 257/76 |
| 2011/0216797 | A1* | 9/2011 | Watanabe et al. | 372/45.012 |
| 2013/0009166 | A1* | 1/2013 | Ito et al. | 257/76 |
| 2013/0056746 | A1* | 3/2013 | Joshin | 257/76 |
| 2013/0292698 | A1* | 11/2013 | Then et al. | 257/76 |

FOREIGN PATENT DOCUMENTS

| | | |
|---|---|---|
| JP | 2009-4398 A1 | 1/2009 |
| JP | 2009-4743 A1 | 1/2009 |
| JP | 2009-164158 A1 | 7/2009 |
| JP | 2010-40814 A1 | 2/2010 |

OTHER PUBLICATIONS

M. Fagerlind, et al.; "Investigation of the interface between silicon nitride passivations and AlGaN/AlN/GaN heterostructures by C(V) characterization of metal-insulator-semiconductor-heterostructure capacitors;" Journal of Applied Physics; vol. 108; 2010; pp. 014508-1-014508-6 (6 Sheets)/Cited in International Search Report.

International Search Report for International Application No. PCT/JP2011/056580 dated May 31, 2011.

* cited by examiner

COMPOUND SEMICONDUCTOR DEVICE AND MANUFACTURING METHOD THEREOF

CROSS-REFERENCE TO RELATED APPLICATION

This application is a continuation application of International Application PCT/JP2011/056580 filed on Mar. 18, 2011 and designated the U.S., the entire contents of which are incorporated herein by reference.

FIELD

The embodiments relate to a compound semiconductor device and a manufacturing method thereof.

BACKGROUND

Conventionally, a study for a high electron mobility transistor (HEMT) in which an AlGaN layer and a GaN layer are formed over a substrate by crystal growth, and the GaN layer functions as an electron transit layer has been performed. A band gap of GaN is 3.4 eV, and it is larger than a band gap of Si (1.1 eV) and a band gap of GaAs (1.4 eV). Accordingly, a break-down voltage of a GaN-based HEMT is high, and it is expectable as a high break-down voltage electronic device for a motor vehicle and so on.

On the other hand, a body diode inevitably exists in a Si-based field-effect transistor. The body diode is connected in inverse parallel to the transistor, and has enough surge resistance by causing avalanche breakdown even when a die voltage (surge) for a short time occurs. However, a body diode like that of the Si-based field-effect transistor does not inevitably exist in the GaN-based HEMT, and troubles and so on may occur when a surge occurs. Conventionally, a varistor, an RC surge absorption circuit, and so on are used as a surge countermeasure element.

However, a large capacitance is parasitic on the surge countermeasure element, and therefore, there are cases when heat generation is large, and operation of a HEMT is slow. The large heat generation leads to deterioration of operation efficiency, and a delay of an operation speed of a HEMT leads to a switching loss at a switching element. Besides, a shoot-through current is easy to flow in the element at a normal operation time of a HEMT, and therefore, a power consumption is large. Further, operation speed of a HEMT is faster than the surge countermeasure element, and therefore, there is a case when a current flows in a HEMT before a surge countermeasure element operates even if a surge countermeasure element is used.

PRIOR ART DOCUMENT

Patent Document

Patent Document 1: Japanese Laid-open Patent Publication No. 2002-252552
Patent Document 2: Japanese Laid-open Patent Publication No. 2009-164158
Patent Document 3: Japanese Laid-open Patent Publication No. 2009-4398

SUMMARY

According to an aspect of the embodiments, a compound semiconductor device includes, a first electrode; an intrinsic first compound semiconductor layer over the first electrode; a second compound semiconductor layer whose band gap is smaller than that of the first compound semiconductor layer on the first compound semiconductor layer; and a second electrode over the second compound semiconductor layer.

According to another aspect of the embodiments, a compound semiconductor device includes, a first electrode; a conductive substrate; an intrinsic first compound semiconductor layer over the conductive substrate; a second compound semiconductor layer whose band gap is smaller than that of the first compound semiconductor layer on the first compound semiconductor layer; an electron supply layer over the second compound semiconductor layer; and a source electrode, a gate electrode and a drain electrode over the electron supply layer, wherein the conductive substrate and the drain electrode are connected with each other.

According to another aspect of the embodiments, a manufacturing method of a compound semiconductor device includes: forming an intrinsic first compound semiconductor layer over a first electrode; forming a second compound semiconductor layer whose band gap is smaller than that of the first compound semiconductor layer on the first compound semiconductor layer; and forming a second electrode over the second compound semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be concretely described referring to the accompanying drawings.

First Embodiment

Figure 1:
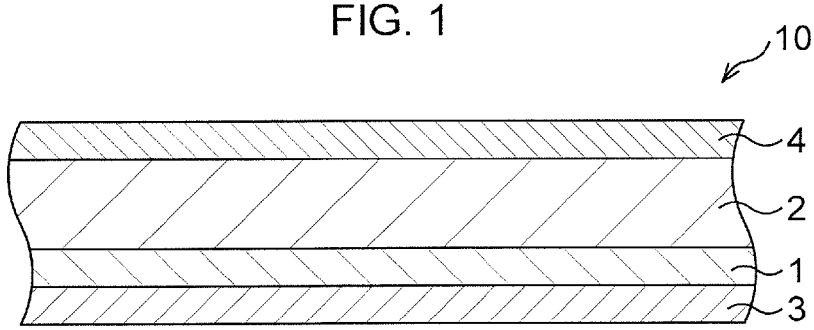
FIG. 1 is a sectional view illustrating a structure of a compound semiconductor device according to a first embodiment.

First, a first embodiment is described. FIG. 1 is a sectional view illustrating a structure of a compound semiconductor device (surge countermeasure element) according to the first embodiment.

In a surge countermeasure element 10 according to the first embodiment, an intrinsic compound semiconductor layer 1 is formed over an electrode 3, a compound semiconductor layer 2 whose band gap is smaller than that of the compound semiconductor layer 1 is formed on the compound semiconductor layer 1, and an electrode 4 is formed over the compound semiconductor layer 2, as illustrated in FIG. 1. For example, the compound semiconductor layer 1 contains AlN or AlGaN, and the compound semiconductor layer 2 contains GaN. For example, the compound semiconductor layer 1 is thinner than the compound semiconductor layer 2, and a thickness of the compound semiconductor layer 1 is approximately 1 nm to 1000 nm, and a thickness of the compound semiconductor layer 2 is approximately 10 nm to 10000 nm.

Figure 2A:
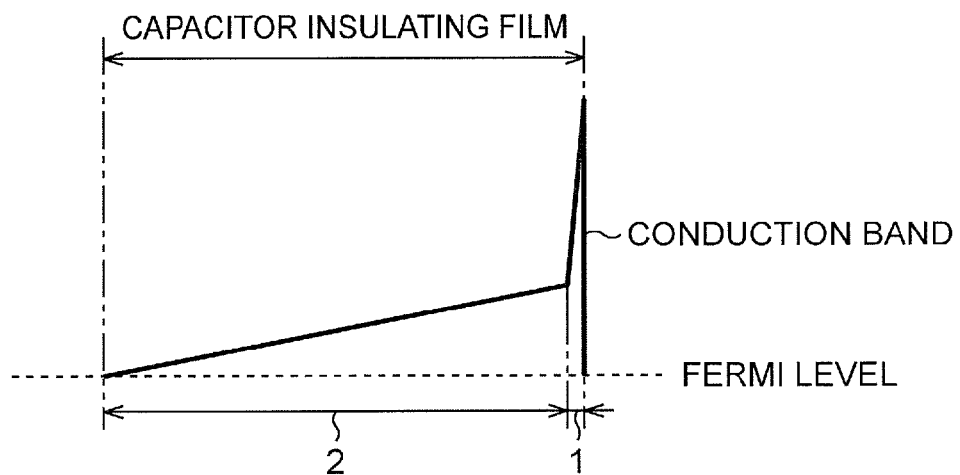
FIG. 2A is a view illustrating a conduction band when a voltage is not applied.
Figure 2B:
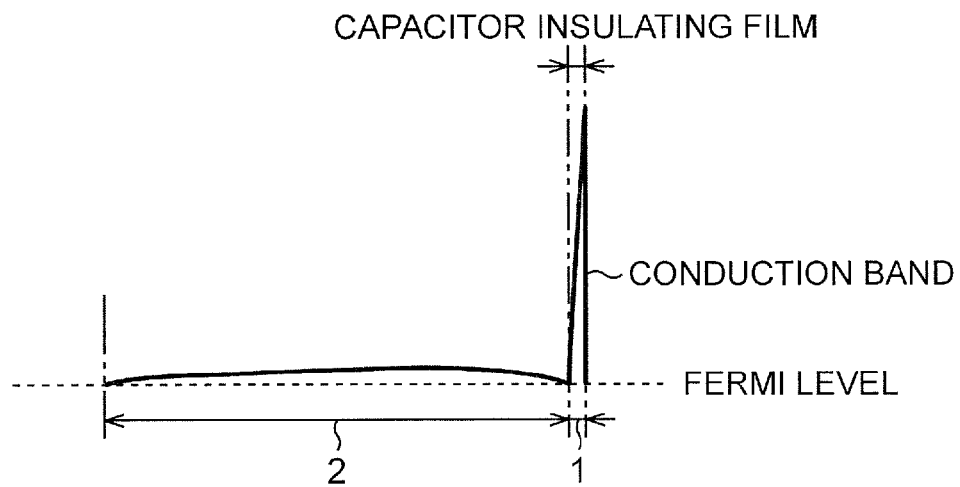
FIG. 2B is a view illustrating a conduction band when a predetermined voltage is applied.

In the surge countermeasure element 10, conduction bands of the compound semiconductor layer 1 and the compound semiconductor layer 2 are higher than the Fermi-level as illustrated in FIG. 2A, and the compound semiconductor layer 1 and the compound semiconductor layer 2 function as a capacitor insulating film when a voltage is not applied between the electrode 3 and the electrode 4. Besides, when an electric potential higher than the electrode 4 is applied to the electrode 3, the conduction band of the compound semiconductor layer 2 is lowered. When the electric potential higher than the electrode 4 for a certain value is applied to the electrode 3, the conduction band of a boundary of the compound semiconductor layer 1 and the compound semiconductor layer 2 is lowered to the Fermi-level as illustrated in FIG. 2B, and only the compound semiconductor layer 2 functions as a capacitor insulating film. Namely, when a potential difference between the electrode 3 and the electrode 4 reaches a certain value, an effective distance of the capacitance between the electrode 3 and the electrode 4 abruptly decreases and a surge withstand increases.

Figure 3:
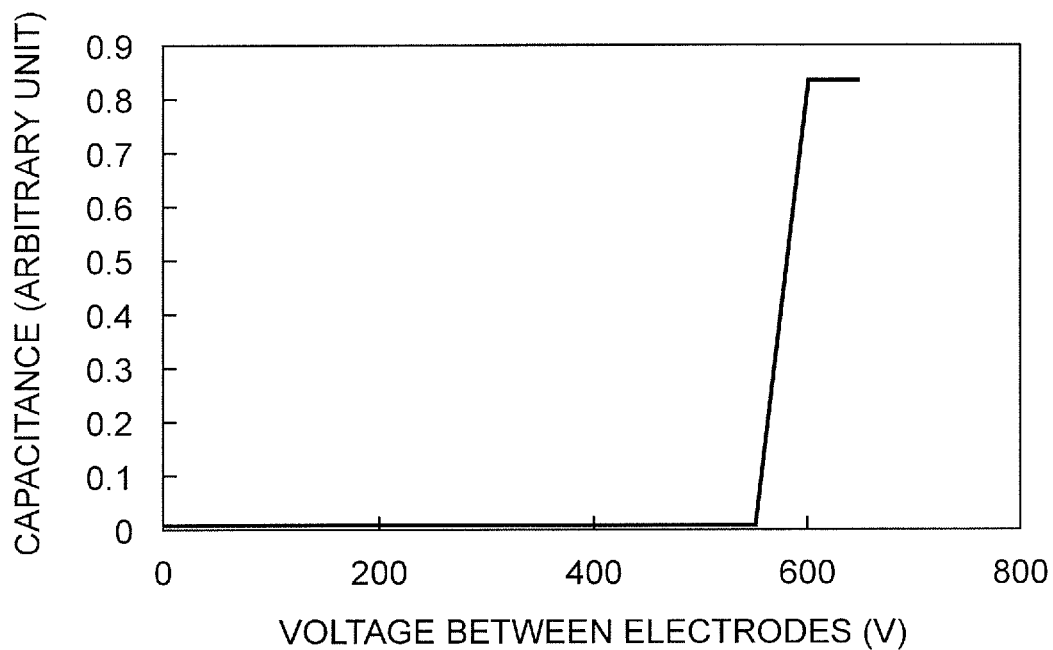
FIG. 3 is a view illustrating a relationship between a voltage between electrodes and capacitance.

For example, when a potential difference between the electrode 3 and the electrode 4 (voltage between electrodes) is less than a certain threshold value (approximately 550 V), a capacitance between the electrode 3 and the electrode 4 is extremely small as illustrated in FIG. 3. On the other hand, when the potential difference between the electrode 3 and the electrode 4 is the threshold value or more, the capacitance between the electrode 3 and the electrode 4 abruptly increases, and the surge withstand increases.

Figure 4:
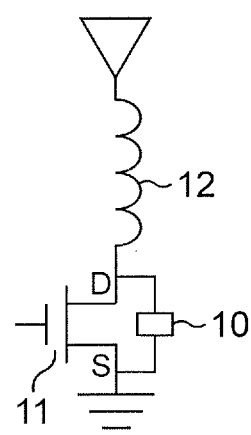
FIG. 4 is a view illustrating a configuration example of a switching circuit.
Figure 5:
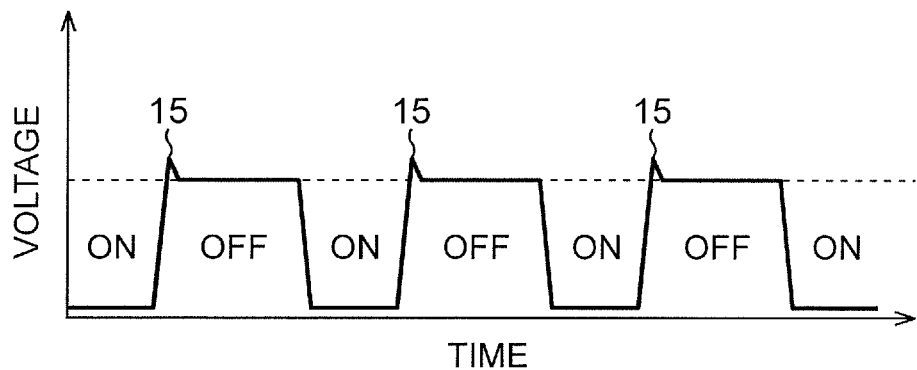
FIG. 5 is a view illustrating an operation example of a switching circuit.

The surge countermeasure element 10 may be used by being connected to an HEMT 11 used as, for example, a switching element of a switching circuit as illustrated in FIG. 4. Namely, the electrode 3 of the surge countermeasure element 10 is connected to a drain of the HEMT 11 which is connected between a terminal to which a power supply voltage is supplied and a ground terminal, and the electrode 4 is connected to a source of the HEMT 11. In the switching circuit constituted as stated above, turning on/off of the HEMT 11 being the switching element is repeated as illustrated in FIG. 5. When it is switched from on to off, the surge occurs effected by an inductor 12 which is parasitic on the switching circuit, but the capacitance of the surge countermeasure element 10 abruptly increases without being inferior to operation speed of the HEMT 11. Accordingly, it is possible to suppress rounding of a signal waveform in accordance with the occurrence of the surge.

As stated above, it is possible to suppress the heat generation and the increase of the power consumption according to the first embodiment, because a current is difficult to flow in the surge countermeasure element 10 during a normal operation of the HEMT 11. Accordingly, it is possible to operate the HEMT 11 with high efficiency. Besides, it is possible to maintain high-speed operation of the HEMT 11. Further, it is possible to appropriately protect the HEMT 11 when an excessive surge flows in.

It is preferable that at least a part of the compound semiconductor layer 2 is doped to p-type. It is because a higher break-down voltage may be obtained if a p-type impurity is doped.

Figure 6:
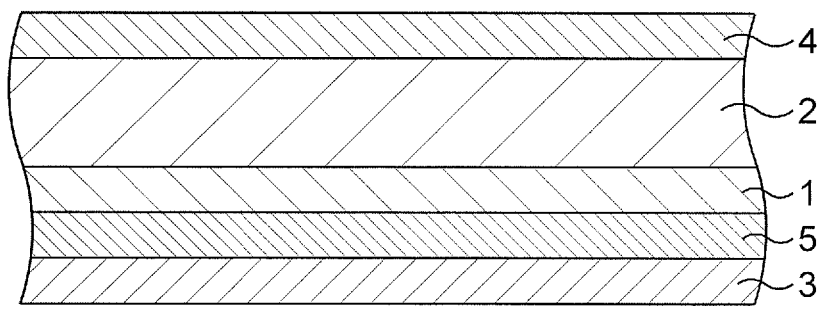
FIG. 6 is a sectional view illustrating a modification example of the first embodiment.

A compound semiconductor layer 5 whose band gap is smaller than that of the compound semiconductor layer 1 may be formed between the electrode 3 and the compound semiconductor layer 1 as illustrated in FIG. 6. For example, the compound semiconductor layer 5 contains n-type or intrinsic GaN. For example, a thickness of the compound semiconductor layer 5 is approximately 1 nm to 5000 nm. It is possible to adjust a voltage between electrodes, an operation speed, and so on by which the capacitance of the surge countermeasure element abruptly changes in accordance with the thickness and an impurity concentration distribution of the compound semiconductor layer 5.

Figure 7:
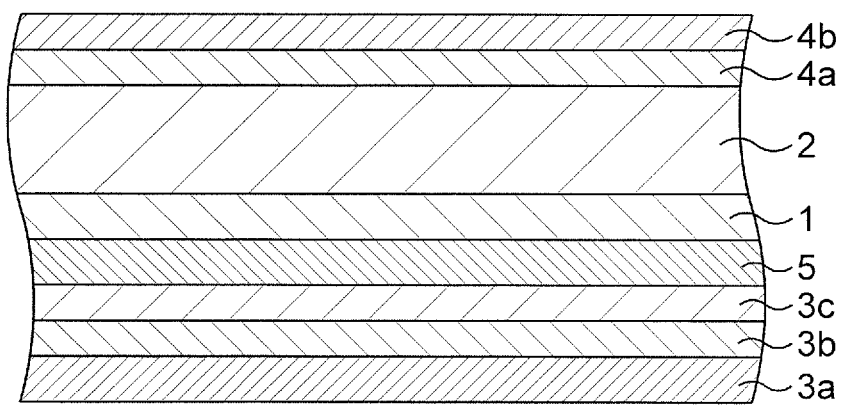
FIG. 7 is a sectional view illustrating another modification example of the first embodiment.

A stack including a conductive substrate 3a, a conductive buffer layer 3b, and a contact layer 3c may be used as the electrode 3, and a stack of a contact layer 4a and a metal film 4b may be used as the electrode 4, as illustrated in FIG. 7. The conductive substrate 3a is, for example, a conductive Si substrate, a conductive SiC substrate, a conductive GaN substrate, or the like. For example, an n-type impurity is doped into the conductive substrate 3a. For example, the conductive buffer layer 3b contains n-type AlN or AlGaN, and the contact layer 3c contains n-type GaN. For example, a thickness of the conductive buffer layer 3b is approximately 1 nm to 1000 nm, and a thickness of the contact layer 3c is approximately 1 nm to 5000 nm. For example, the contact layer 4a contains n-type GaN, and a thickness thereof is approximately 1 nm to 5000 nm. The metal film 4b includes, for example, a stack of a Ta film whose thickness is approximately 20 nm and an Al film whose thickness is approximately 200 nm on the Ta film. In an example illustrated in FIG. 7, the compound semiconductor layer 5 is provided as an example illustrated in FIG. 6, but the compound semiconductor layer 5 may not be provided as an example illustrated in FIG. 1.

Figure 8A:
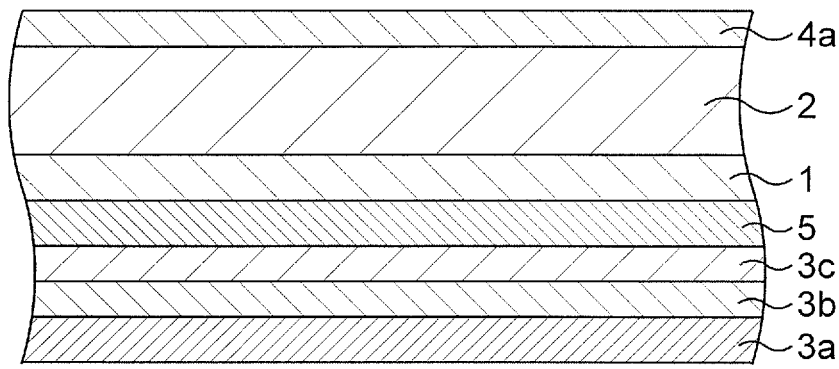
FIG. 8A to FIG. 8B are sectional views illustrating a method manufacturing of a surge countermeasure element in process sequence.
Figure 8B:
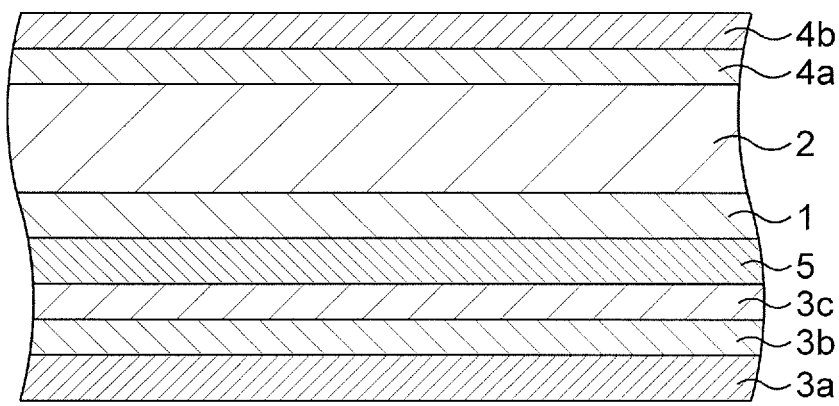

Next, a method of manufacturing the surge countermeasure element illustrated in FIG. 7 is described. FIG. 8A to FIG. 8B are sectional views illustrating the method of manufacturing the surge countermeasure element in process sequence.

First, as illustrated in FIG. 8A, the conductive buffer layer 3b, the contact layer 3c, the compound semiconductor layer 5, the compound semiconductor layer 1, the compound semiconductor layer 2, and the contact layer 4a are formed over the conductive substrate 3a by, for example, a metal organic chemical vapor deposition (MOCVD) method. These may be formed by a molecular beam epitaxy (MBE) method.

Figure 9:
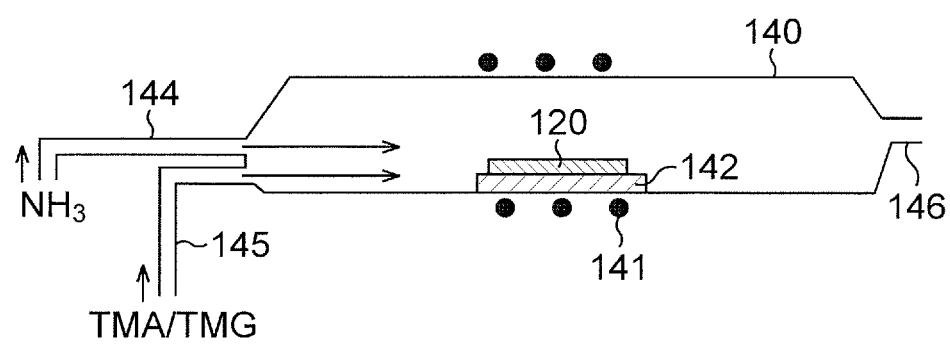
FIG. 9 is a view illustrating a configuration of an MOCVD equipment.

Here, an MOCVD equipment is described. FIG. 9 is a view illustrating a configuration of a MOCVD equipment. A high-frequency coil 141 is disposed at a periphery of a quartz reaction tube 140, and a carbon susceptor 142 to mount a substrate 120 thereon is disposed inside the reaction tube 140.

Two gas introducing pipes 144, 145 are connected at an upstream end of the reaction pipe 140 (an end part at a left side in FIG. 9), and source gas of a compound is supplied. For example, NH$_3$ gas is introduced as N source gas from the gas introducing pipe 144, and an organic III-group compound raw material such as trimethylaluminum (TMA), trimethylgallium (TMG) is introduced as source gas of a III-group element from the gas introducing pipe 145. A crystal growth is conducted on the substrate 120, and excessive gas is discharged from a gas discharge pipe 146 to an abatement tower. When the crystal growth by the MOCVD method is performed in a reduced pressure atmosphere, the gas discharge pipe 146 is connected to a vacuum pump, and a discharge port of the vacuum pump is connected to the abatement tower.

When these layers are formed, presence/absence of supply and a flow rate of the TMA gas as an Al source and the TMG gas as a Ga source are appropriately set in accordance with a kind of a layer to be formed. Further, when the n-type impurity is to be contained, for example, gas containing Si such as SiH$_4$ gas is added to raw material gas at a predetermined flow rate to dope Si to be a predetermined value within the above-stated each concentration range.

Conditions for forming an AlN layer are set as follows, for example.
Flow rate of trimethylaluminum (TMA): 1 sccm to 50 sccm,
Flow rate of ammonia (NH$_3$): 10 sccm to 5000 sccm,
Pressure: 100 Torr,
Temperature: 1100° C.

Conditions for forming a GaN layer are set as follows, for example.
Flow rate of trimethylgallium (TMG): 1 sccm to 50 sccm,
Flow rate of ammonia (NH$_3$): 10 sccm to 10000 sccm,
Pressure: 100 Torr,
Temperature: 1100° C.

Conditions for forming an Al$_{0.25}$Ga$_{0.75}$N layer as an AlGaN layer are set as follows, for example.
Flow rate of trimethylgallium (TMG): "0" (zero) sccm to 50 sccm,
Flow rate of trimethylaluminum (TMA): "0" (zero) sccm to 50 sccm,
Flow rate of ammonia (NH$_3$): 20 slm,
Pressure: 100 Torr,
Temperature: 1100° C.

Conditions for forming an n-type GaN layer are set as follows, for example.
Flow rate of trimethylgallium (TMG): 1 sccm to 50 sccm,
Flow rate of ammonia (NH$_3$): 10 sccm to 10000 sccm,
n-type impurity: silane (SiH$_4$),
Pressure: 100 Torr,
Temperature: 1100° C.

After the contact layer 4a is formed, the metal film 4b is formed over the contact layer 4a as illustrated in FIG. 8B. The metal film 4b may be formed by, for example, a sputtering method.

It is possible to manufacture the surge countermeasure element illustrated in FIG. 7 as stated above. The surge countermeasure element illustrated in FIG. 1 and the surge countermeasure element illustrated in FIG. 6 may also be manufactured by similar processes.

Second Embodiment

Figure 10:
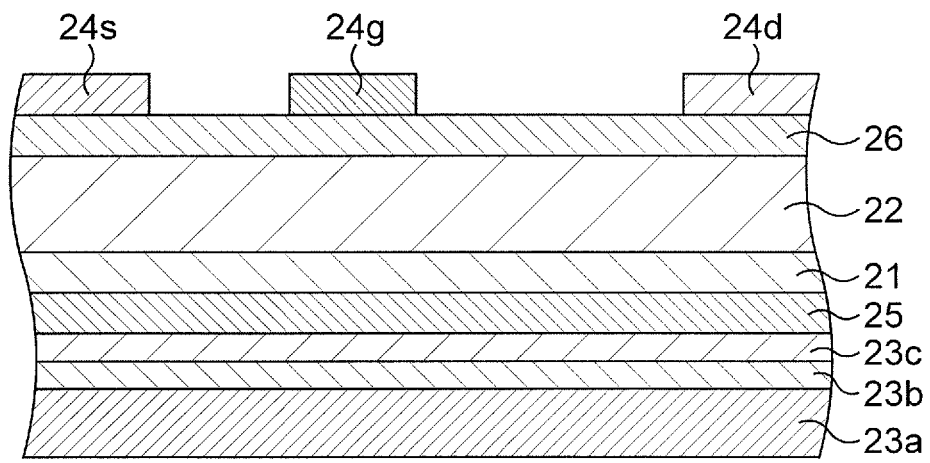
FIG. 10 is a sectional view illustrating a structure of a compound semiconductor device according to a second embodiment.

Next, a second embodiment is described. FIG. 10 is a sectional view illustrating a structure of a compound semiconductor device according to the second embodiment. A GaN-based HEMT and a surge countermeasure element are included in the compound semiconductor device.

In the compound semiconductor device according to the second embodiment, a conductive buffer layer 23b, a contact layer 23c, a GaN layer 25, an intrinsic AlN layer 21, a GaN layer 22, and an n-type AlGaN layer 26 are formed on a conductive substrate 23a as illustrated in FIG. 10. A gate electrode 24g is formed on the AlGaN layer 26. A source electrode 24s and a drain electrode 24d are also formed on the AlGaN layer 26 to sandwich the gate electrode 24g between them in a plan view.

The conductive substrate 23a is, for example, a conductive Si substrate, a conductive SiC substrate, a conductive GaN substrate, or the like. For example, an n-type impurity is doped into the conductive substrate 23a. For example, the conductive buffer layer 23b contains n-type AlN or AlGaN, and a thickness thereof is approximately 1 nm to 1000 nm. For example, the contact layer 23c contains n-type GaN, and a thickness thereof is approximately 1 nm to 5000 nm. For example, a thickness of the GaN layer 25 is approximately 1 nm to 5000 nm, a thickness of the AlN layer 21 is approximately 1 nm to 1000 nm, a thickness of the GaN layer 22 is approximately 10 nm to 10000 nm, and a thickness of the AlGaN layer 26 is approximately 1 nm to 200 nm. The gate electrode 24g includes, for example, a stack of an Ni film whose thickness is approximately 30 nm and an Au film whose thickness is approximately 400 nm on the Ni film. The source electrode 24s and the drain electrode 24d each include, for example, a stack of a Ta film whose thickness is approximately 20 nm and an Al film whose thickness is approximately 200 nm formed on the Ta film. The drain electrode 24d is connected to the conductive substrate 23a.

In the compound semiconductor device constituted as stated above, the GaN layer 22 functions as an electron transit layer of the HEMT, and the AlGaN layer 26 functions as an electron supply layer of the HEMT. The AlN layer 21 functions like the compound semiconductor layer 1 of the surge countermeasure element 10 according to the first embodiment does, and the GaN layer 22 functions like the compound semiconductor layer 2 of the surge countermeasure element 10 according to the first embodiment does.

Accordingly, the HEMT in the compound semiconductor device according to the second embodiment is able to perform high-speed and appropriate operations owing to an action of the surge countermeasure element.

Figure 11:
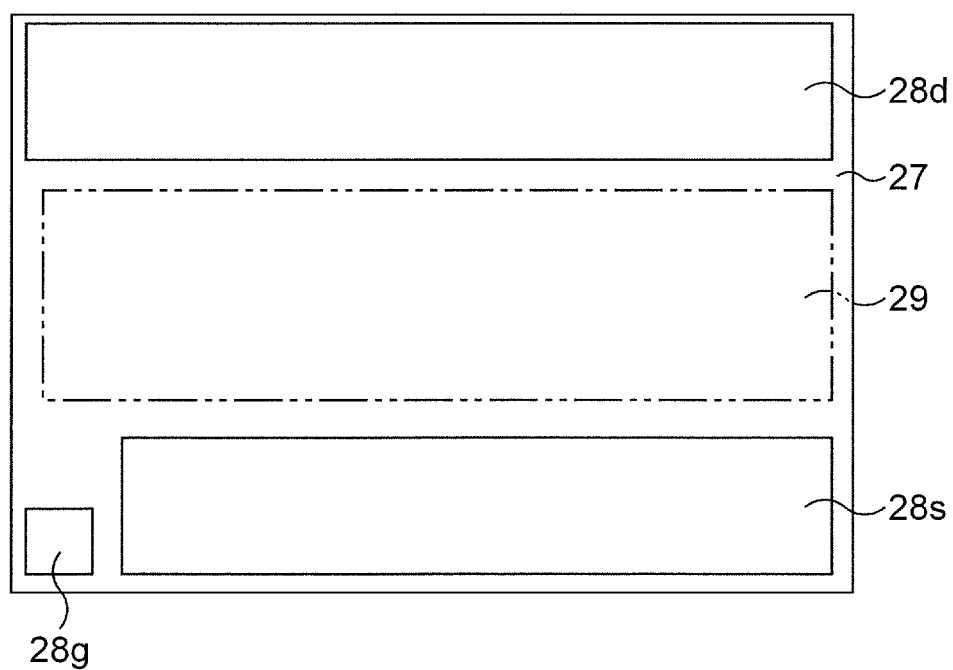
FIG. 11 is a plan view illustrating a structure of the compound semiconductor device according to the second embodiment.

The stacked structure as stated above is covered by a passivation film 27 such as a silicon nitride film as illustrated in FIG. 11. The gate electrode 24g is connected to a gate pad 28g, the source electrode 24s is connected to a source pad 28s, and the drain electrode 24d is connected to a drain pad 28d. The gate pad 28g, the source pad 28s, and the drain pad 28d are exposed from the passivation film 27, and bonding wires, terminals, or the like are connected thereto. Besides, the HEMT illustrated in FIG. 10 is disposed in a transistor region 29.

An AlGaN layer may be formed instead of the AlN layer 21. An intrinsic AlGaN layer may be formed as a spacer layer between the GaN layer 22 and the AlGaN layer 26.

It is preferable that at least a part of the GaN layer 22 is doped to p-type. It is because a higher break-down voltage may be obtained if a p-type impurity is doped.

Figure 12A:
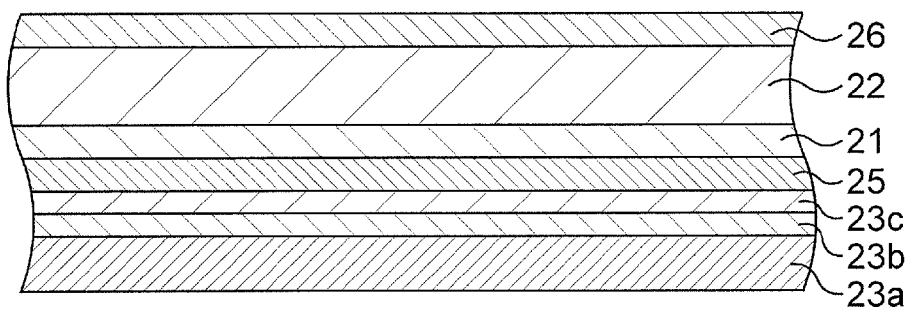
FIG. 12A to FIG. 12C are sectional views illustrating a method of manufacturing the compound semiconductor device according to the second embodiment in process sequence.
Figure 12B:
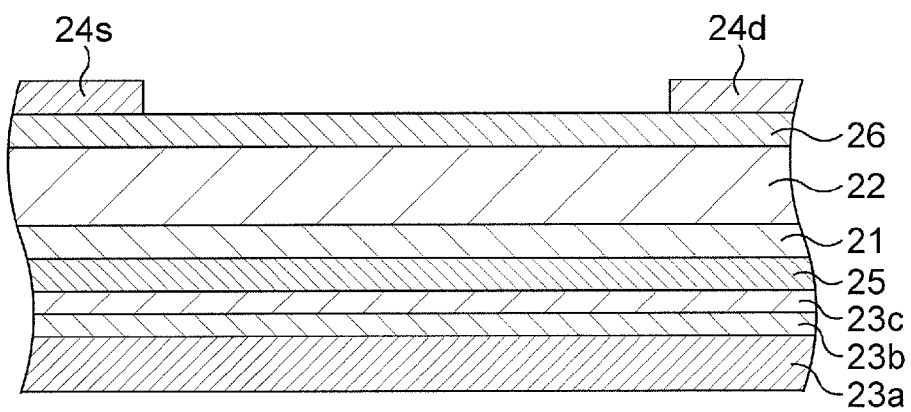
Figure 12C:
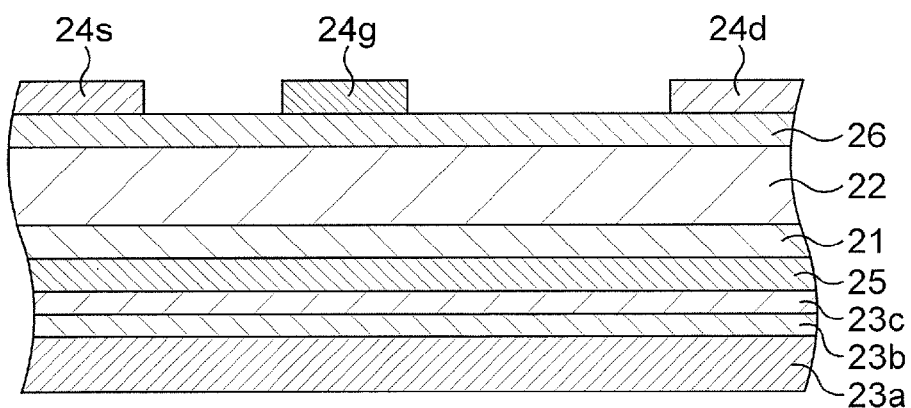

Next, a method manufacturing the compound semiconductor device according to the second embodiment is described. FIG. 12A to FIG. 12C are sectional views illustrating the method of manufacturing the compound semiconductor device in process sequence.

First, the conductive buffer layer 23b, the contact layer 23c, the GaN layer 25, the intrinsic AlN layer 21, the GaN layer 22, and the n-type AlGaN layer 26 are formed over the conductive substrate 23a by, for example, an MOCVD method, as illustrated in FIG. 12A. These may be formed by an MBE method.

After the AlGaN layer 26 is formed, the source electrode 24s and the drain electrode 24d are formed over the AlGaN layer 26, as illustrated in FIG. 12B. The source electrode 24s and the drain electrode 24d may be formed by, for example, a lift-off method. Namely, a resist pattern may be formed in which an opening part opening a region where the source electrode 24s is to be formed and an opening part opening a region where the drain electrode 24d is to be formed are formed, a Ta film and an Al film may be formed by, for example, a sputtering method, and the resist pattern may be removed together with the Ta film and the Al film on the resist pattern.

After the source electrode 24s and the drain electrode 24d are formed, the gate electrode 24g is formed over the AlGaN layer 26 so as to be sandwiched between the source electrode 24s and the drain electrode 24d in a plan view, as illustrated in FIG. 12O. The gate electrode 24g may be formed, for example, nearer to the source electrode 24s than to the drain electrode 24d. The gate electrode 24g may be formed by, for example, a lift-off method. Namely, a resist pattern may be formed in which an opening part opening a region where the gate electrode 24g is to be formed is formed, a Ni film and a Au film may be formed by, for example, a vapor deposition method, and the resist pattern may be removed together with the Ni film and the Au film on the resist pattern.

The compound semiconductor device according to the second embodiment may be manufactured as stated above. The stack of the conductive substrate 23a, the conductive buffer layer 23b, and the contact layer 23c may be considered as one electrode.

A HEMT (compound semiconductor device) which is combined with the surge countermeasure element 10 according to the first embodiment and the compound semiconductor device according to the second embodiment each may be used for, for example, a switching element. The switching element as stated above may be used for a switching power supply or an electronic equipment. These compound semiconductor devices may be used as components of a full bridge power circuit such as a power supply circuit of a server.

According to these compound semiconductor devices and so on, it is possible to suppress the surge effect while reducing the parasitic capacitance.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

According to the compound semiconductor devices, it is possible to suppress a surge effect while suppressing increase of a parasitic capacitance because the relationship of the band gaps between the intrinsic first compound semiconductor layer and the second compound semiconductor layer is appropriate.

What is claimed is:

1. A compound semiconductor device, comprising:
a first electrode;
an intrinsic first compound semiconductor layer over the first electrode;
a second compound semiconductor layer whose band gap is smaller than that of the first compound semiconductor layer on the first compound semiconductor layer; and
a second electrode over the second compound semiconductor layer, wherein
the first compound semiconductor layer and the second compound semiconductor layer are in direct contact with each other,
the second compound semiconductor layer and the second electrode are in direct contact with each other,
the first compound semiconductor layer and the second compound semiconductor layer each contain nitride semiconductor, and
the nitride semiconductor of the first compound semiconductor layer is aluminum gallium nitride.

2. A compound semiconductor device, comprising:
a first electrode;
an intrinsic first compound semiconductor layer over the first electrode;
a second compound semiconductor layer whose band gap is smaller than that of the first compound semiconductor layer on the first compound semiconductor layer;
a second electrode over the second compound semiconductor layer, and
a third compound semiconductor layer whose band gap is smaller than that of the first compound semiconductor layer between the first electrode and the first compound semiconductor layer, wherein
the first compound semiconductor layer and the second compound semiconductor layer are in direct contact with each other,
the second compound semiconductor layer and the second electrode are in direct contact with each other, and
the first compound semiconductor layer and the third compound semiconductor layer are in direct contact with each other.

3. The compound semiconductor device according to claim 2, wherein the third compound semiconductor layer contains nitride semiconductor.

4. A compound semiconductor device, comprising:
a first electrode;
an intrinsic first compound semiconductor layer over the first electrode;
a second compound semiconductor layer whose band gap is smaller than that of the first compound semiconductor layer on the first compound semiconductor layer; and
a second electrode over the second compound semiconductor layer, wherein
the first compound semiconductor layer and the second compound semiconductor layer are in direct contact with each other,
the second compound semiconductor layer and the second electrode are in direct contact with each other, and
at least a part of the second compound semiconductor layer is doped to p-type.

5. A manufacturing method of a compound semiconductor device, comprising:
forming an intrinsic first compound semiconductor layer over a first electrode;

forming a second compound semiconductor layer whose band gap is smaller than that of the first compound semiconductor layer on the first compound semiconductor layer; and forming a second electrode over the second compound semiconductor layer, wherein the first compound semiconductor layer and the second compound semiconductor layer are in direct contact with each other, the second compound semiconductor layer and the second electrode are in direct contact with each other, the second compound semiconductor layer is an electron transit layer, the second electrode contains a source electrode, a gate electrode, and a drain electrode, and the method comprises further forming an electron supply layer over the second compound semiconductor layer between the forming the second compound semiconductor layer and the forming the second electrode.

6. A manufacturing method of a compound semiconductor device, comprising:

forming an intrinsic first compound semiconductor layer over a first electrode;

forming a second compound semiconductor layer whose band gap is smaller than that of the first compound semiconductor layer on the first compound semiconductor layer; and forming a second electrode over the second compound semiconductor layer, wherein the first compound semiconductor layer and the second compound semiconductor layer are in direct contact with each other, the second compound semiconductor layer and the second electrode are in direct contact with each other, and the method further comprises forming a third compound semiconductor layer whose band gap is smaller than that of the first compound semiconductor layer over the first electrode, before the forming the first compound semiconductor layer, wherein the first compound semiconductor layer and the third compound semiconductor layer are in direct contact with each other.

7. The manufacturing method of the compound semiconductor device according to claim 6, wherein the third compound semiconductor layer contains nitride semiconductor.

* * * * *